（12）United States Patent
Kaneda (10) Patent No.: US 11,978,609 B2
(45) Date of Patent: May 7, 2024

(54) ELECTRON GUN AND CHARGED PARTICLE BEAM DEVICE EQUIPPED WITH ELECTRON GUN

(71) Applicant: Hitachi High-Tech Corporation, Tokyo (JP)

(72) Inventor: Minoru Kaneda, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 370 days.

(21) Appl. No.: 17/595,599

(22) PCT Filed: May 21, 2019

(86) PCT No.: PCT/JP2019/020122
§ 371 (c)(1),
(2) Date: Nov. 19, 2021

(87) PCT Pub. No.: WO2020/235003
PCT Pub. Date: Nov. 26, 2020

(65) Prior Publication Data
US 2022/0230835 A1    Jul. 21, 2022

(51) Int. Cl.
*H01J 37/09* (2006.01)
*H01J 37/073* (2006.01)
(Continued)

(52) U.S. Cl.
CPC ............ *H01J 37/09* (2013.01); *H01J 37/073* (2013.01); *H01J 37/075* (2013.01); *H01J 37/28* (2013.01); *H01J 2237/06316* (2013.01)

(58) Field of Classification Search
CPC ........ H01J 37/09; H01J 37/073; H01J 37/075; H01J 37/28; H01J 2237/06316; H01J 2237/061; H01J 2237/06341
(Continued)

(56) References Cited

U.S. PATENT DOCUMENTS 5,059,859 A   10/1991   Endo et al.
8,859,982 B2  10/2014   Jiang et al.
(Continued)

FOREIGN PATENT DOCUMENTS

JP   52-129272 A   10/1977
JP   2-273443 A    11/1990
(Continued)

OTHER PUBLICATIONS

Japanese-language Office Action issued in Japanese Application No. 2021-519942 dated Nov. 8, 2022 with English translation (10 pages).
(Continued)

*Primary Examiner* — Kiet T Nguyen
(74) *Attorney, Agent, or Firm* — Crowell & Moring LLP (57) ABSTRACT

An electron gun EG in which mixing of secondary electrons is suppressed is provided. The electron gun EG has an electron source 1, an extraction electrode 2 for extracting an electron beam E1 from the electron source 1, and an acceleration electrode for accelerating the extracted electron beam E1. The extraction electrode 2 includes a diaphragm 4 for allowing a part of the electron beam E1 to pass through, a shield 5 positioned above the diaphragm 4 apart from the diaphragm 4, and a shield 6 positioned below the diaphragm 4 apart from the diaphragm 4. The diaphragm 4 has an opening OP4 having an opening diameter D4, the shield 5 has an opening OP5 having an opening diameter D5 which is greater than the opening diameter D4, and the shield 6 has an opening OP6 having an opening diameter D6 which is greater than the opening diameter D4.

13 Claims, 5 Drawing Sheets

(51) Int. Cl.
*H01J 37/075* (2006.01)
*H01J 37/28* (2006.01)

(58) Field of Classification Search
USPC .......................................................... 250/310
See application file for complete search history.

(56) References Cited

U.S. PATENT DOCUMENTS

| | | | |
|---|---|---|---|
| 2008/0088316 A1* | 4/2008 | Suhara | G01R 29/14 250/492.3 |
| 2010/0019648 A1 | 1/2010 | Yasuda et al. | |
| 2010/0320942 A1 | 12/2010 | Hayn | |
| 2011/0266465 A1* | 11/2011 | Shichi | H01J 37/08 250/492.3 |
| 2014/0197336 A1 | 7/2014 | Watanabe et al. | |
| 2016/0104597 A1 | 4/2016 | Imai et al. | |

FOREIGN PATENT DOCUMENTS

| | | |
|---|---|---|
| JP | 2006-120470 A | 5/2006 |
| JP | 2008-117662 A | 5/2008 |
| JP | 2013-45525 A | 3/2013 |
| JP | 2014-216182 A | 11/2014 |
| JP | 2015-531984 A | 11/2015 |
| WO | WO 2008/120412 A1 | 10/2008 |

OTHER PUBLICATIONS

International Search Report (PCT/ISA/210) issued in PCT Application No. PCT/JP2019/020122 dated Aug. 6, 2019 with English translation (four (4) pages).
Japanese-language Written Opinion (PCT/ISA/237) issued in PCT Application No. PCT Application No. PCT/JP2019/020122 dated Aug. 6, 2019 (four (4) pages).

* cited by examiner

ELECTRON GUN AND CHARGED PARTICLE BEAM DEVICE EQUIPPED WITH ELECTRON GUN

TECHNICAL FIELD

The present invention relates to an electron gun and a charged particle beam device including the electron gun, and particularly, can be suitably used for an electron gun including a diaphragm on an extraction electrode.

BACKGROUND ART

In a charged particle beam device such as a scanning electron microscope (SEM), for example, a Schottky type or electric field emission type electron gun is used in order to stably extract a high-luminance current with a narrow energy width. Generally, an electron gun includes an extraction electrode that generates a strong electric field in order to extract electrons to a tip of an electron source, and the extraction electrode includes a diaphragm for limiting electrons passing through the extraction electrode.

US-A-2010/0320942 (PTL 1) discloses a technique for providing a recess on a surface of the extraction electrode of the electron gun.

JP-A-2013-45525 (PTL 2) discloses a technique in which the extraction electrode of the electron gun includes a two-stage diaphragm and surfaces thereof are coated with carbon.

JP-A-2008-117662 (PTL 3) discloses a technique of suppressing an angle of the electron beam passing through the diaphragm to a predetermined range by providing a two-stage diaphragm on the extraction electrode of the electron gun.

WO-A-2008/120412 (PTL 4) discloses a technique in which a permanent magnet is arranged in an electron accelerating portion of the electron gun, and the electron beam emitted from the electron source is converged by a magnetic field from the permanent magnet.

CITATION LIST

Patent Literature

PTL 1: US-A-2010/0320942
PTL 2: JP-A-2013-45525
PTL 3: JP-A-2008-117662
PTL 4: WO-A-2008/120412

SUMMARY OF INVENTION

Technical Problem

An electron beam emitted from an electron source of an electron gun is accelerated by an acceleration electrode and irradiates a sample to be inspected through an electron lens such as a focusing lens, an objective lens, and the like. In this case, for example, in a scanning electron microscope, secondary electrons generated when the electron beam collides with the sample are detected, and the structure of the sample is observed and analyzed.

At this time, a bright region called flare may sometimes occur around the observed main spot. Then, the flare causes problems such as a decrease in the S/N ratio of the observation image and a decrease in the resolution. As one of the causes of the flare, a case is considered where the secondary electrons generated inside the electron gun are mixed in the electron beam emitted from the electron source. Therefore, for the electron gun, a technique is desired, which is capable of suppressing mixing of secondary electrons into the electron beam, and for a charged particle beam device, a technique for suppressing generation of the flare as much as possible is required.

Other issues and novel features will become apparent from the description of the present specification and the accompanying drawings.

Solution to Problem

The outline of a certain representative example of the embodiments disclosed in the present application will be briefly described below.

An electron gun according to an embodiment includes an electron source, an extraction electrode for extracting an electron beam from the electron source, and an acceleration electrode for accelerating the extracted electron beam. Here, the extraction electrode includes a diaphragm for allowing a part of the electron beam to pass through, a first shield positioned above the diaphragm apart from the diaphragm, and a second shield positioned below the diaphragm apart from the diaphragm. Further, the diaphragm includes a first opening having a first opening diameter, the first shield includes a second opening having a second opening diameter greater than the first opening diameter, and the second shield includes a third opening having a third opening diameter greater than the first opening diameter.

Advantageous Effects of Invention

According to an embodiment, it is possible to provide an electron gun in which mixing of the secondary electrons is suppressed. In addition, the accuracy of the observation image obtained by the charged particle beam device including such an electron gun can be improved.

DESCRIPTION OF EMBODIMENTS

Hereinbelow, embodiments will be described in detail with reference to the drawings. In all the drawings for illustrating the embodiments, the members having the same functions are designated by the same reference numerals, and the repeated description thereof will be omitted. Further, in the following embodiments, the description of the same or similar components is not repeated in principle except when it is particularly necessary.

Further, in the drawings used in the embodiment, hatching may be omitted even in the cross-sectional view in order to make the drawings easier to see.

First Embodiment

An electron gun EG according to a first embodiment will be described below with reference to FIGS. 1 and 2. In this example, the electron gun EG is a Schottky type electron gun, for example.

For example, the electron gun EG includes an electron source 1 formed of a tungsten single crystal, a filament 7 welded to the electron source 1, a zirconium oxide layer 8 coated on the electron source 1, and a suppressor electrode 9 provided around the electron source 1. The filament 7 is provided to heat the electron source 1, and the suppressor electrode 9 is provided to suppress thermionic electrons generated from the filament 7.

Further, the electron gun EG includes an extraction electrode 2 for generating a strong electric field in order to extract electrons from the electron source 1, and an acceleration electrode 3 for accelerating the extracted electrons to a predetermined energy.

The extraction electrode 2 includes a diaphragm 4 for limiting an incident angle of an electron beam E1 (primary electron, electron beam) and allowing a part of the electron beam E1 to pass through, a shield 5 (electric field shielding plate) positioned above the diaphragm 4, and a shield 6 (electric field shielding plate) positioned below the diaphragm 4. The diaphragm 4 and the shield 5 are separated from each other by a sufficient distance, and the diaphragm 4 and the shield 6 are separated from each other by a sufficient distance.

Further, each of the diaphragm 4, the shield 5, and the shield 6 is formed of a conductive material and of a material having high heat resistance. Such materials are metals and mainly include molybdenum (Mo), tantalum (Ta) or tungsten (W), for example. Further, the materials also include the above metals coated on their surfaces with platinum-palladium, carbon or the like.

Figure 2:
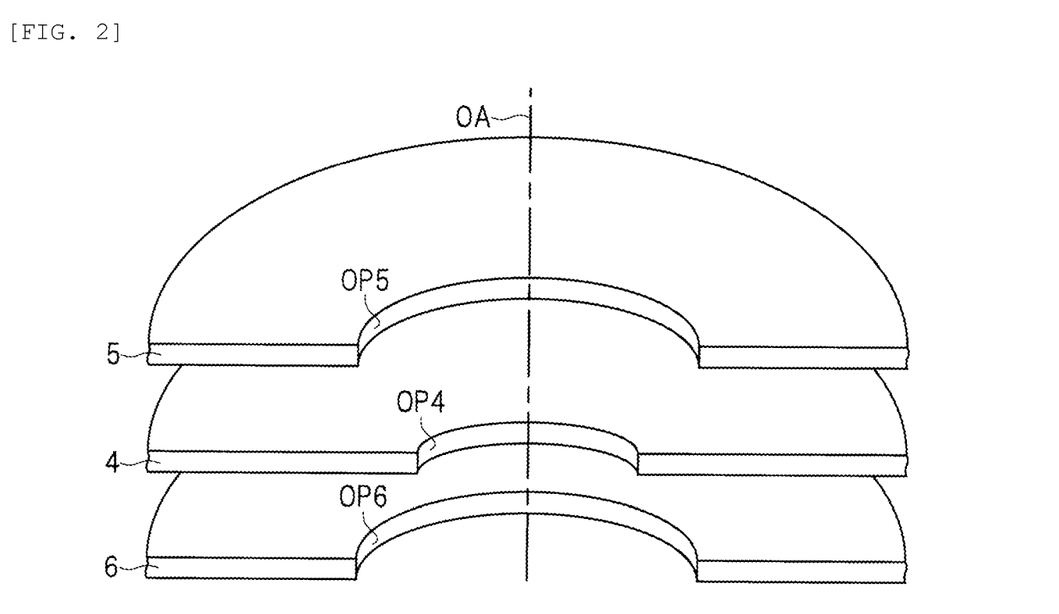
FIG. 2 is a perspective view illustrating a peripheral structure of a diaphragm provided on an extraction electrode according to the first embodiment.

FIG. 2 is a partial perspective view illustrating in enlargement the peripheries of the diaphragm 4, the shield 5, and the shield 6 provided on the extraction electrode 2.

The diaphragm 4 includes an opening OP4, and a part of the electron beam E1 emitted from the electron source 1 is passed through the inside of the opening OP4. The shield 5 and the shield 6 include an opening OP5 and an opening OP6, respectively, and the opening diameter of each of the opening OP5 and the opening OP6 is greater than the opening diameter of the opening OP4. Note that although each of the openings OP4 to OP6 is illustrated as a semicircular shape in FIG. 2, these are actually in circular shapes centered on an optical axis OA.

In the first embodiment, the main features of the electron gun EG include the shield 5 provided above the diaphragm 4 and the shield 6 provided below the diaphragm 4, and the shapes of the same, and such features will be described in detail below by comparison with the study examples.

The basic operation of the electron gun EG in FIG. 1 will be described below.

A tip of the electron source 1 is sharply etched, and a negative potential V0 with respect to the ground potential is applied to the electron source 1. While a negative voltage Vs is applied to the suppressor electrode 9, when currents are flowed through the filament 7 from a current source If, the filament 7 is heated, and the zirconium oxide layer 8 coated on the electron source 1 is diffused toward the tip of the electron source 1. At this time, when a positive voltage V1 is applied to the extraction electrode 2, the electric field near the tip of the electron source 1 is increased, and the electron beam E1 is emitted from the crystal plane of the electron source 1 toward the extraction electrode 2 due to the Schottky effect. Most of the electron beam E1 emitted from the electron source 1 is shielded by the extraction electrode 2 including the diaphragm 4, the shield 5, and the shield 6, but a part of the electron beam E1 is passed through the diaphragm 4 (the opening OP4). The electron beam E1 passed through the diaphragm 4 is accelerated by the acceleration electrode 3 and emitted from the electron gun EG.

The same voltage is applied to each of the diaphragm 4, the shield 5, and the shield 6 provided on the extraction electrode 2, and the positive voltage V1 is applied as in the extraction electrode 2.

Figure 3:
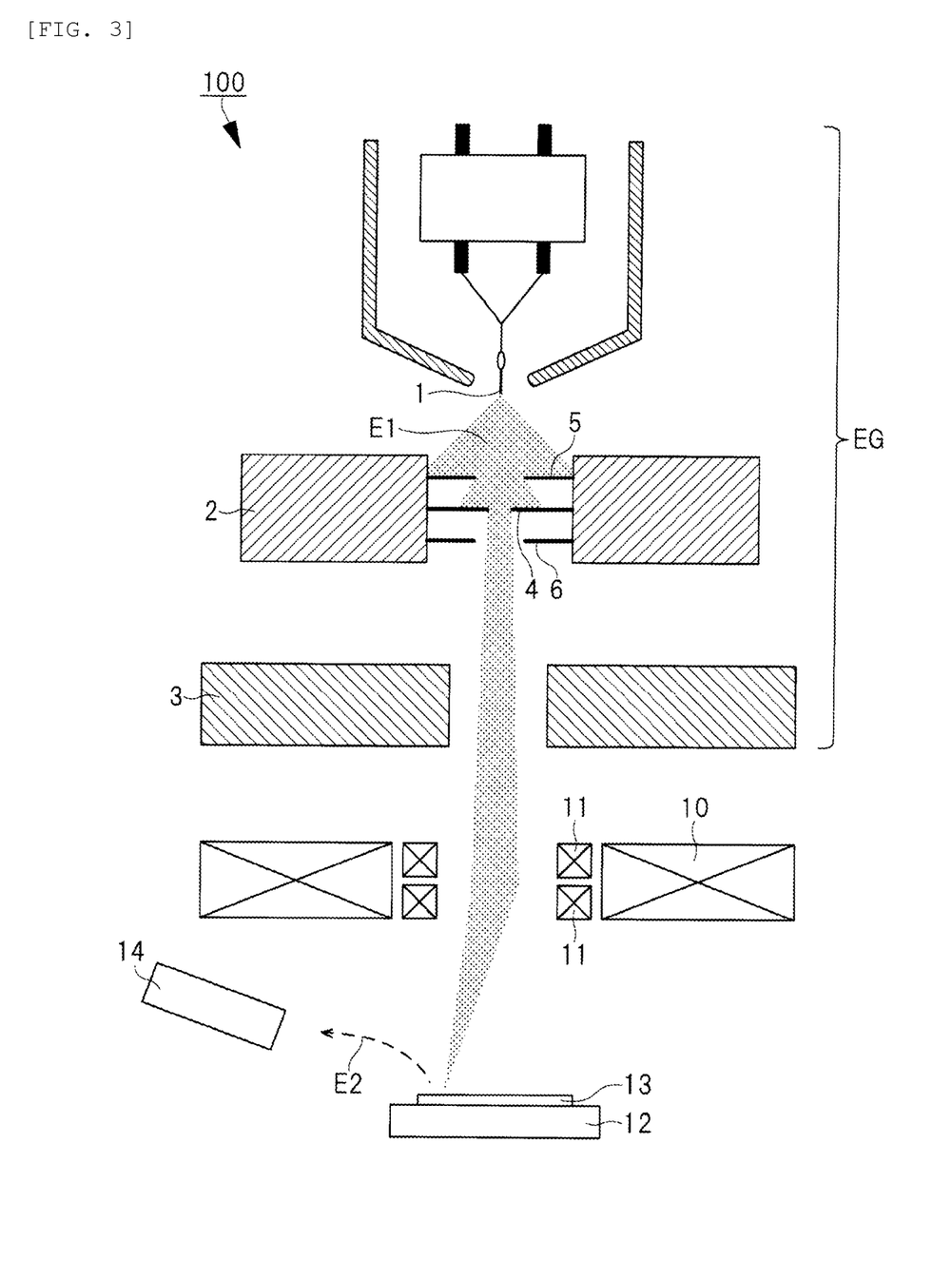
FIG. 3 is a schematic view illustrating a charged particle beam device according to the first embodiment.

FIG. 3 is a schematic view illustrating a charged particle beam device 100 including the electron gun EG described with reference to FIGS. 1 and 2. In addition, in the first embodiment, the charged particle beam device 100 is a scanning electron microscope (SEM), for example.

As illustrated in FIG. 3, the charged particle beam device 100 includes the electron gun EG, an electron lens 10, a deflection coil 11, a stage 12, and a detector 14. Actually, these are included in one housing, and this housing also includes a control circuit and the like for controlling each configuration, although illustrations thereof are omitted herein.

To observe a sample 13 to be inspected, the sample 13 is mounted on the stage 12. The electron beam E1 emitted from the electron gun EG is reduced to a specific magnification by the electron lens 10 and focused as an electron spot on the sample 13. The electron lens 10 is an electromagnet having a coil, and the electromagnetic field generated from the electron lens 10 serves as a lens that exerts a focusing action on the electron beam E1. Further, the electron beam E1 is scanned over a desired position in the sample 13 by the deflection coil 11.

For example, the detector 14 is a secondary electron detector, and detects secondary electrons E2 that are generated from the sample 13 when the electron beam E1 collides with the sample 13. An SEM image can be obtained by displaying the amount of the detected secondary electrons E2 as brightness on an image processing device or the like electrically connected to the detector 14.

Note that, in addition to the detector 14 described above, the charged particle beam device 100 may include a backscattered electron detector for detecting backscattered electrons, an X-ray detector for detecting the spectrum of X-rays generated from the sample 13 and performing elemental analysis of the sample 13, and the like.

<Structure of Extraction Electrode 2 of Electron Gun in Study Example and Problems Thereof>

Figure 4:
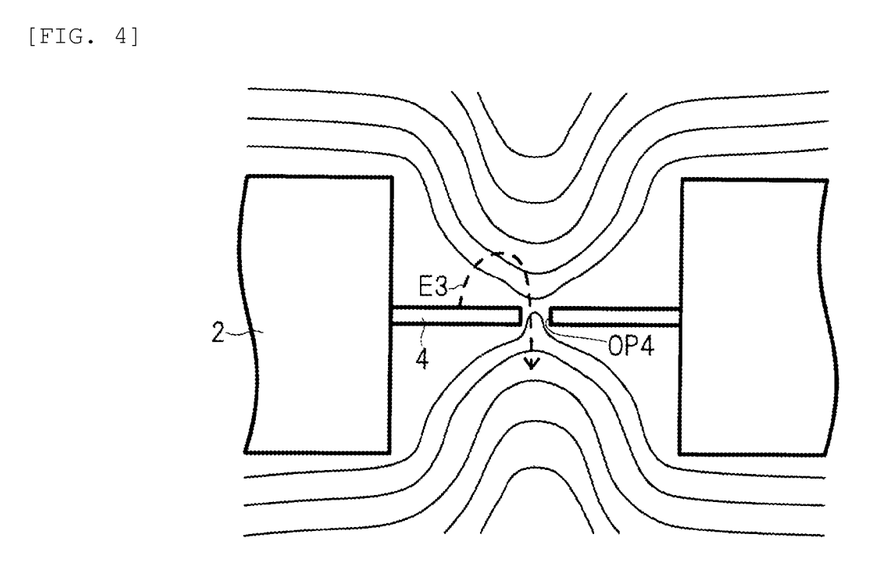
FIG. 4 is an enlarged cross-sectional view illustrating a main part of an electron gun in a study example.

FIG. 4 is an enlarged cross-sectional view illustrating a main part of an electron gun in the study example, illustrating the structure of the extraction electrode 2. Further, FIG. 4 also illustrates the equipotential lines and secondary electrons E3 generated around the extraction electrode 2.

The electron gun and the extraction electrode 2 in the study example have substantially the same structure as the electron gun EG and the extraction electrode 2 in the first embodiment, but are different from the first embodiment in that the shield 5 and the shield 6 are not provided above and below the diaphragm 4.

Most of the electron beam E1 that does not pass through the opening OP4 of the diaphragm 4 collides with the diaphragm 4 and is absorbed by the diaphragm 4. However, as illustrated in FIG. 4, some of such electron beams E1 generate the secondary electrons E3 at the time of collision. While there is a large number of secondary electrons E3 actually generated, only one secondary electron E3 is illustrated herein as an example.

In the vicinity of the opening OP4 of the diaphragm 4, a part of the electric field formed between the extraction electrode 2 and the acceleration electrode 3 slightly protrudes from the lower side toward the upper side of the opening OP4. Due to this protruding electric field, the secondary electrons E3 generated in the vicinity of the opening OP4 receive a force in the direction of passing through the diaphragm 4 (to lower side of the opening OP4), further are accelerated by the acceleration electrode 3, are mixed with the electron beam E1, and are emitted from the electron gun EG.

The secondary electrons E3 emitted from the electron gun EG have lower energy than the electron beam E1 which is the primary electron (main beam) directly emitted from the electron source 1, but are observed as a flare in the charged particle beam device 100. As described above, the flare causes a decrease in the S/N ratio and a decrease in the resolution of the observation image in the charged particle beam device 100.

<Main Features of Electron Gun EG in First Embodiment>

Figure 5:
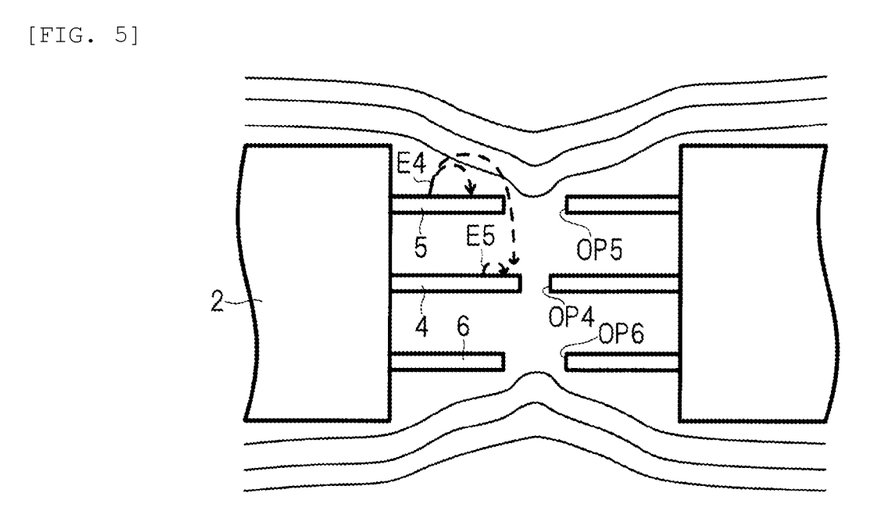
FIG. 5 is an enlarged cross-sectional view illustrating a main part of an electron gun according to the first embodiment.

The electron gun EG in the first embodiment is one devised in order to suppress the problem of the study example described above. FIG. 5 corresponds to the same region as that of FIG. 4, and illustrates the structure of the extraction electrode 2 in the first embodiment.

As illustrated in FIG. 5, in the first embodiment, the shield 5 is provided above the diaphragm 4. When the electron beam E1 collides with the shield 5 or the extraction electrode 2, secondary electrons E4 are generated, and when the electron beam E1 collides with the diaphragm 4, secondary electrons E5 are generated. Further, since the opening diameter of the opening OP6 is smaller than the opening diameter of the opening OP4, the electron beam E1 does not collide with the shield 6. That is, secondary electrons are not generated from the shield 6.

In this case, in the vicinity of the opening OP5 of the shield 5, a part of the electric field formed between the electron gun EG and the extraction electrode 2 slightly protrudes downward toward the lower side in the opening OP5. Further, in the vicinity of the opening OP6 of the shield 6, a part of the electric field formed between the acceleration electrode 3 and the extraction electrode 2 slightly protrudes upward toward the upper side in the opening OP6.

However, since the diaphragm 4 is separated from the shield 5 and the shield 6 at sufficient distance, the peripheries of the diaphragm 4 and the opening OP4 are in an electric field-free state, and at least the inside of the opening OP4 has no electric field. Therefore, as illustrated in FIG. 5, most of the low-energy secondary electrons E4 is not passed through the opening OP5 and easily absorbed by the surface of the shield 5 or the extraction electrode 2. In this case, a part of the secondary electrons E4 may sometimes be passed through the opening OP5 and headed toward the diaphragm 4. However, since the opening diameter of the opening OP4 is smaller than the opening diameter of the opening OP5, the secondary electrons E4 are blocked by the diaphragm 4 and hardly pass through the opening OP4 of the diaphragm 4.

Further, for the secondary electrons E5 generated in the diaphragm 4, since there is no electric field around the diaphragm 4 and the opening OP4, the secondary electrons E5 are easily absorbed by the surface of the diaphragm 4. As illustrated in FIG. 1 and the like, the high-energy electron beam E1 is passed through the opening OP4 toward the acceleration electrode 3 side and emitted from the electron gun EG.

As described above, since mixing of the secondary electrons E4 and E5 generated in the shield 5 and the diaphragm 4 and the electron beam E1 which is the main beam is suppressed, the occurrence of flare during observation using the charged particle beam device 100 is reduced.

Hereinafter, the relative relationship between the shapes of the diaphragm 4, the shield 5, and the shield 6 included in the extraction electrode 2 will be described with reference to FIGS. 6 and 7. Regarding the structures of the diaphragm 4, the shield 5, and the shield 6, reference is also made to the FIG. 2 described above.

Further, in other words, the side of the diaphragm 4 in the opening OP4, the side of the shield 5 in the opening OP5, and the side of the shield 6 in the opening OP6 are the ends of the diaphragm 4, the shield 5, and the shield 6 in the cross-sectional view. Therefore, in the following description, each side may be described as an end of the diaphragm 4, an end of the shield 5, and an end of the shield 6.

Figure 6:
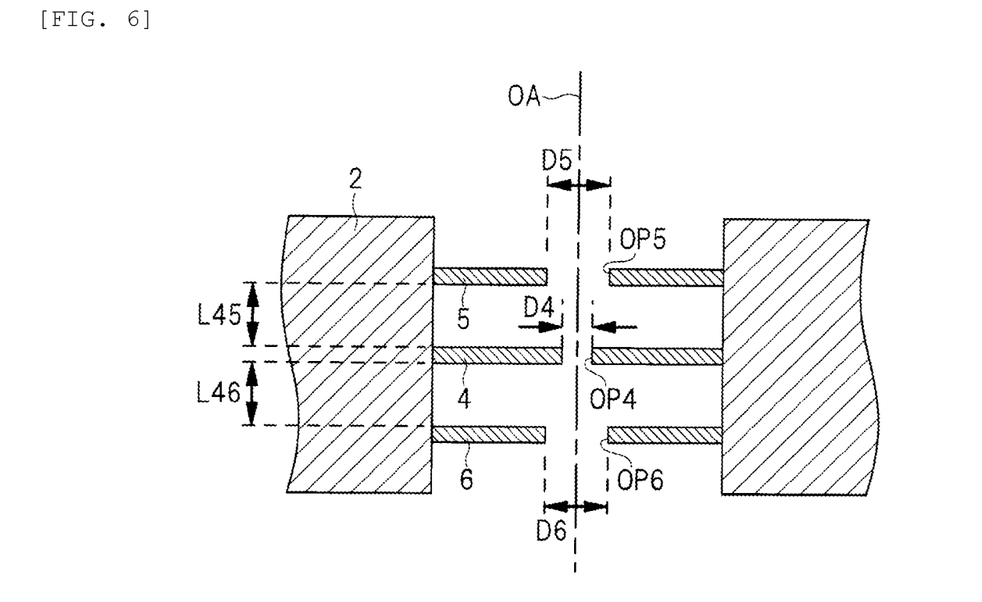
FIG. 6 is an enlarged cross-sectional view illustrating a main part of the electron gun according to the first embodiment.

As illustrated in FIG. 6, an opening diameter D5 of the opening OP5 is greater than an opening diameter D4 of the opening OP4. Further, in a plan view, the opening OP4 overlaps with the opening OP5 and is included in the opening OP5. In other words, the end of the shield 5 is positioned closer to the extraction electrode 2 than the end of the diaphragm 4. In other words, the end of the shield 5 is positioned farther from the optical axis OA than the end of the diaphragm 4. This is because the electron beam E1 is blocked by the shield 5 before the electron beam E1 reaches the diaphragm 4 when the opening diameter D5 is smaller than the opening diameter D4. Basically, the passage of the electron beam E1 in the first embodiment is controlled by the shape of the diaphragm 4, rather than by the shape of the shield 5.

Further, a distance L45 between the shield 5 and the diaphragm 4 is the same as the opening diameter D5 of the opening OP5 or greater than the opening diameter D5. Further, a distance L46 between the shield 6 and the diaphragm 4 is the same as an opening diameter D6 of the opening OP6 or greater than the opening diameter D6. By increasing the distance L45 and the distance L46, the periphery of the diaphragm 4 is less likely to be affected by the electric fields from the shield 5 and the shield 6, and is likely to be in an electric field-free state. Further, since the aspect ratio defined by "the distance L45/the opening diameter D5" increases, it is difficult for the secondary electrons E4 generated in the vicinity of the shield 5 to reach the diaphragm 4.

The opening diameter D6 of the opening OP6 is greater than the opening diameter D4 of the opening OP4. Further, in a plan view, the opening OP4 overlaps with the opening OP6 and is included in the opening OP6. In other words, the end of the shield 6 is positioned closer to the extraction electrode 2 than the end of the diaphragm 4. In other words, the end of the shield 6 is positioned farther from the optical axis OA than the end of the diaphragm 4. This is because when the opening diameter D6 is the same as the opening diameter D4 or smaller than the opening diameter D4, the electron beam E1 passed through the diaphragm 4 is blocked by the shield 6. This will be described in more detail with reference to FIG. 7.

Figure 7:
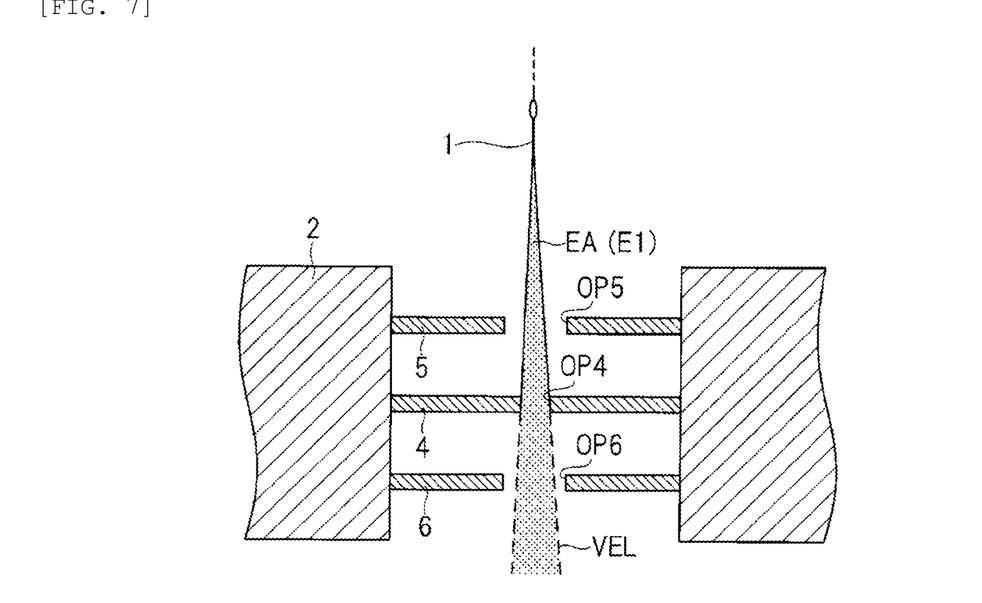
FIG. 7 is an enlarged cross-sectional view illustrating a main part of the electron gun according to the first embodiment.

The electron beam region EA illustrated in FIG. 7 represents a region in which a part of the electron beam E1 emitted from the electron source 1 is passed through the opening OP4 of the diaphragm 4. In FIG. 7, the electron beam region EA is a region surrounded by the lines connecting the tip of the electron source 1 and the sides of the diaphragm 4 in the opening OP4, and virtual extension lines VEL below the opening OP4. When drawing the lines connecting the tip of the electron source and the sides of the diaphragm 4 in the opening OP4, the virtual extension lines VEL may be extended from these lines to the shield 6 side, and are represented by broken lines.

Below the opening OP4, the electron beam E1 has a strong tendency to be focused inside (to the optical axis side) the virtual extension lines VEL, so that there is no or few electron beams E1 passed outside the virtual extension lines VEL.

In this case, the shape of the opening OP6 of the shield 6 needs to be considered so as not to block the electron beam region EA. Therefore, the end of the shield 6 is preferably positioned outside the virtual extension lines VEL and is preferably positioned closer to the extraction electrode 2 than the virtual extension lines VEL. In other words, the opening diameter D6 of the opening OP6 is adjusted such that the virtual extension lines VEL do not come into contact with the shield 6 and are extended through the inside of the opening OP6.

Further, the opening diameter D5 and the opening diameter D6 are individually determined mainly by the strength of the electric field between the electron beam E1 and the extraction electrode 2 and the strength of the electric field between the acceleration electrode 3 and the extraction electrode 2, respectively. Therefore, the opening diameter D5 and the opening diameter D6 may have the same length or may have different lengths from each other. For the same reason, the distance L45 and the distance L46 may have the same length or may have different lengths from each other.

Meanwhile, the opening diameter D6 has restrictions on the virtual extension lines VEL as described with reference to FIG. 7, but the opening diameter D5 does not have such restrictions.

Therefore, in order to reduce the secondary electrons E4 generated in the vicinity of the shield 5 and suppress flare caused by the secondary electrons E4 more efficiently, the opening diameter D5 may be configured to be smaller than the opening diameter D6.

As described above, by using the electron gun EG of the first embodiment, it is possible to suppress mixing of the secondary electrons E4 and E5 into the electron beam E1. Further, when the electron gun EG is used in the charged particle beam device 100, since mixing of the secondary electrons E4 and E5 is suppressed, the occurrence of flare is reduced, and problems such as a decrease in the S/N ratio of the observation image, a decrease in resolution, and the like are suppressed. That is, the accuracy of the observation image obtained by the charged particle beam device 100 can be improved.

(Modification)

Figure 8:
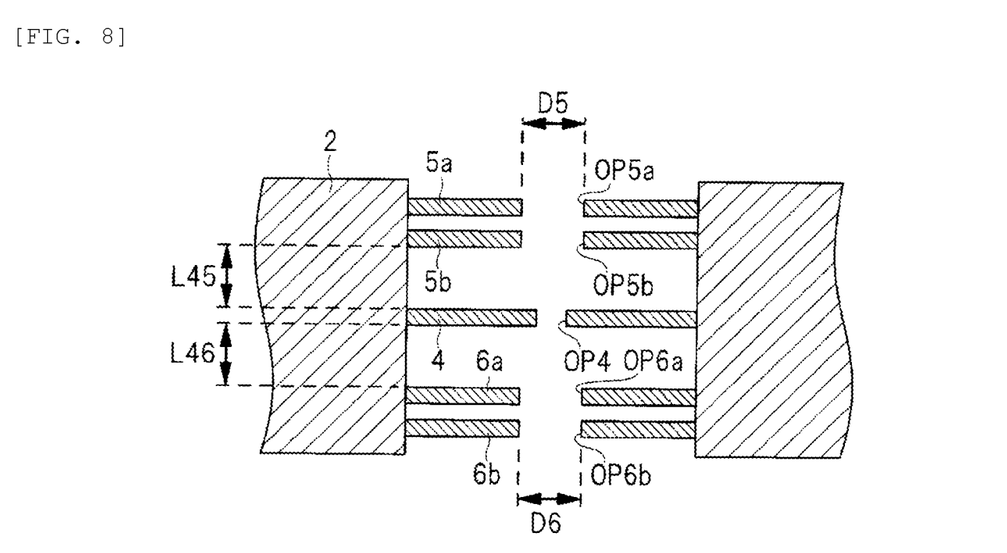
FIG. 8 is an enlarged cross-sectional view illustrating a main part of an electron gun according to a modification.

A modification of the first embodiment will be described below with reference to FIG. 8. In the electron gun EG according to the modification, the structure other than the extraction electrode 2 is the same as that in the first embodiment.

In the first embodiment, the extraction electrode 2 includes one shield 5 and one shield 6, but in the modification, the extraction electrode 2 includes a plurality of shields 5 and a plurality of shields 6. In FIG. 8, as an example of the plurality of shields 5 and the plurality of shields 6, it is illustrated that two shields 5a and 5b are provided above the diaphragm 4, and two shields 6a and 6b are provided below the diaphragm 4.

The shield 5b is positioned above the diaphragm 4 apart from the diaphragm 4, and the shield 5a is positioned above the shield 5b apart from the shield 5b. In addition, the shield 6a is positioned below the diaphragm 4 apart from the diaphragm 4, and the shield 6b is positioned above the shield 6a apart from the shield 6a.

Figure 1:
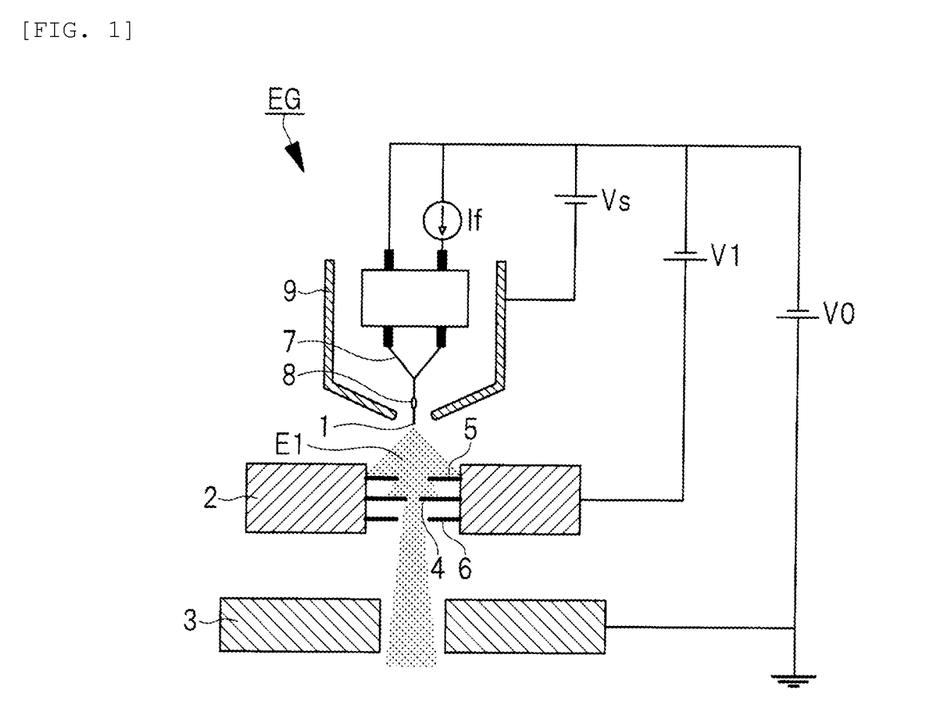
FIG. 1 is a cross-sectional view illustrating an electron gun according to a first embodiment.

The same voltage is applied to the shields 5a and 5b and the shields 6a and 6b, respectively, and the positive voltage V1 illustrated in FIG. 1 is applied thereto in the same manner as the extraction electrode 2 and the diaphragm 4. In addition, the distance L45 and the distance L46 described in FIG. 6 are applied to the respective distances between the shield 5b and the shield 6a closest to the diaphragm 4 and the diaphragm 4.

Further, the opening diameter D5 is applied to the respective opening diameters of openings OP5a and OP5b of the shields 5a and 5b in the same manner as the opening OP5 of the shield 5, and the opening diameter D6 is applied to the respective opening diameters of openings OP6a and OP6b of the shields 6a and 6b in the same manner as the opening OP6 of the shield 6.

Further, respective ends of the shields 6a and 6b are preferably positioned outside the virtual extension lines VEL and are preferably positioned closer to the extraction electrode 2 than the virtual extension lines VEL for the same reason as described in FIG. 7. That is, the opening diameter D6 of the openings OP6a and OP6b is adjusted such that the virtual extension lines VEL are extended through the inside of each of the openings OP6a and OP6b.

As described above, when the extraction electrode 2 includes the plurality of shields 5a and 5b and the plurality of shields 6a and 6b, mixing of the secondary electrons E4 and E5 into the electron beam E1 can also be suppressed. Further, when the electron gun EG according to the modification is used in the charged particle beam device 100, problems such as a decrease in the S/N ratio of the observation image, a decrease in resolution, and the like are also suppressed.

The number of each of the shield 5 and the shield 6 is not limited to two such as the shields 5a and 5b and the shields 6a and 6b, and may be three or more. Further, the number of shields 5 and the number of shields 6 may be different from each other.

Although the present invention has been specifically described above based on the embodiments for carrying out the present invention, the present invention is not limited to the embodiments described above and can be variously modified without departing from the gist thereof.

For example, in the embodiments described above, the Schottky type electron gun EG has been described, but the technique disclosed in the embodiments described above can also be applied to the electric field emission type electron gun.

Further, in the embodiments described above, the scanning electron microscope (SEM) has been described as an example of the charged particle beam device 100 including the electron gun EG, but the technique disclosed in the embodiment described above can also be applied to a scanning transmission electron microscope (STEM) or a transmission electron microscope (TEM).

Further, the idea of the electron gun EG disclosed in the embodiments described above is not limited to the technique of emitting an electron beam, and can be applied to a technique of emitting an ion beam such as a focused ion beam (FIB) device, for example. That is, the electron source 1 can be used as an ion source, the electron gun EG can be used as an ion gun, and the charged particle beam device 100 can be used as an FIB device. In that case, when the ion beam (primary ion) is passed through the diaphragm 4, most of the ion beam collides with the shield 5 or the diaphragm 4, and secondary ions are generated, but it is possible to suppress mixing of the secondary ions into the ion beam by the same technical idea as in the embodiments described above. Therefore, in the FIB device, the occurrence of flare can be suppressed.

Further, the electron gun EG disclosed in the embodiments described above is not limited to an inspection device for obtaining an observation image, and can be applied to a wide range of technical fields as a mechanism for simply emitting an electron beam or an ion beam.

REFERENCE SIGNS LIST

1: electron source
2: extraction electrode
3: acceleration electrode
4: diaphragm
5, 5a, 5b: shield (electric field shielding plate)
6, 6a, 6b: shield (electric field shielding plate)
7: filament
8: zirconium oxide layer
9: suppressor electrode
10: electron lens
11: deflection coil
12: stage
13: sample
14: detector
100: charged particle beam device
D4 to D6: opening diameter
E1: electron beam (primary electron, electron beam)
E2-E5: secondary electron
EA: electron beam region
EG: electron gun
If: current source
L45, L46: distance
OA: optical axis
OP4: opening
OP5, OP5a, OP5b: opening
OP6, OP6a, OP6b: opening

The invention claimed is:

1. An electron gun comprising:
an electron source;
an extraction electrode for extracting an electron beam from the electron source; and
an acceleration electrode for accelerating the extracted electron beam, wherein
the extraction electrode includes a diaphragm for allowing a part of the electron beam to pass through, a first shield positioned above the diaphragm apart from the diaphragm, and a second shield positioned below the diaphragm apart from the diaphragm,
the diaphragm includes a first opening having a first opening diameter,
the first shield includes a second opening having a second opening diameter greater than the first opening diameter, and
the second shield includes a third opening having a third opening diameter greater than the first opening diameter.

2. The electron gun according to claim 1, wherein a same voltage is applied to the extraction electrode, the diaphragm, the first shield, and the second shield.

3. The electron gun according to claim 2, wherein at least an inside of the first opening has no electric field.

4. The electron gun according to claim 1, wherein, in a plan view, the first opening is included in the second opening and the third opening.

5. The electron gun according to claim 1, wherein a first distance between the diaphragm and the first shield is equal to or greater than the second opening diameter.

6. The electron gun according to claim 5, wherein a second distance between the diaphragm and the second shield is equal to or greater than the third opening diameter.

7. The electron gun according to claim 1, wherein, when drawing a line connecting a tip of the electron source and a side of the diaphragm in the first opening, a virtual extension line extending from the line toward the second shield is extended through an inside of the third opening.

8. The electron gun according to claim 7, wherein the second opening diameter is smaller than the third opening diameter.

9. The electron gun according to claim 1, wherein the extraction electrode includes a third shield positioned above the first shield apart from the first shield, and a fourth shield positioned below the second shield apart from the second shield,
the third shield includes a fourth opening having a fourth opening diameter greater than the first opening diameter, and
the fourth shield includes a fifth opening having a fifth opening diameter greater than the first opening diameter.

10. The electron gun according to claim 1, wherein the diaphragm, the first shield, and the second shield are each formed of a conductive material.

11. The electron gun according to claim 10, wherein the conductive material mainly includes molybdenum, tantalum or tungsten.

12. A charged particle beam device including the electron gun according to claim 1.

13. The charged particle beam device according to claim 12, further comprising:
a stage on which a sample can be mounted;
an electron lens for focusing the electron beam emitted from the electron gun; and
a deflection coil for scanning the electron beam to a desired position in the sample when the sample is mounted on the stage.

* * * * *